United States Patent [19]
Elgin, II et al.

[11] Patent Number: 6,150,912
[45] Date of Patent: Nov. 21, 2000

[54] OPEN ARCHITECTURE SUPERCONDUCTING MAGNET HELIUM VESSEL STRUCTURE

[75] Inventors: Stephen R. Elgin, II; Kenneth Edward Grut; Gregory Alan Lehmann; Michelle Guilmet Sansbury; John Scaturro, Jr.; Bu-Xin Xu, all of Florence, S.C.

[73] Assignee: General Electric Company, Milwaukee, Wis.

[21] Appl. No.: 09/441,166

[22] Filed: Nov. 15, 1999

[51] Int. Cl.⁷ .................................................. H01F 5/00
[52] U.S. Cl. ........................... 335/299; 335/216; 505/892
[58] Field of Search .................................... 335/216, 299, 335/301, 302; 324/318–321; 505/892; 62/50.1

[56] References Cited

U.S. PATENT DOCUMENTS 5,721,523  2/1998  Dorri et al. .............................. 335/216
5,883,558  3/1999  Laskaris et al. ........................ 335/216

*Primary Examiner*—Lincoln Donovan
*Assistant Examiner*—Tuyen T. Nguyen
*Attorney, Agent, or Firm*—Irving M. Freedman; Christian G. Cabou; Phyllis Y. Price

[57] ABSTRACT

A magnet cartridge for an open architecture superconducting magnet including an iron ring sandwiched between two coil forms, and including radial and axial positioning and securing apparatus to position, secure and maintain the relative positions of the coils on the coil forms and the iron ring in the presence of the strong superconducting magnet field generated by superconducting operation of said magnet.

15 Claims, 3 Drawing Sheets

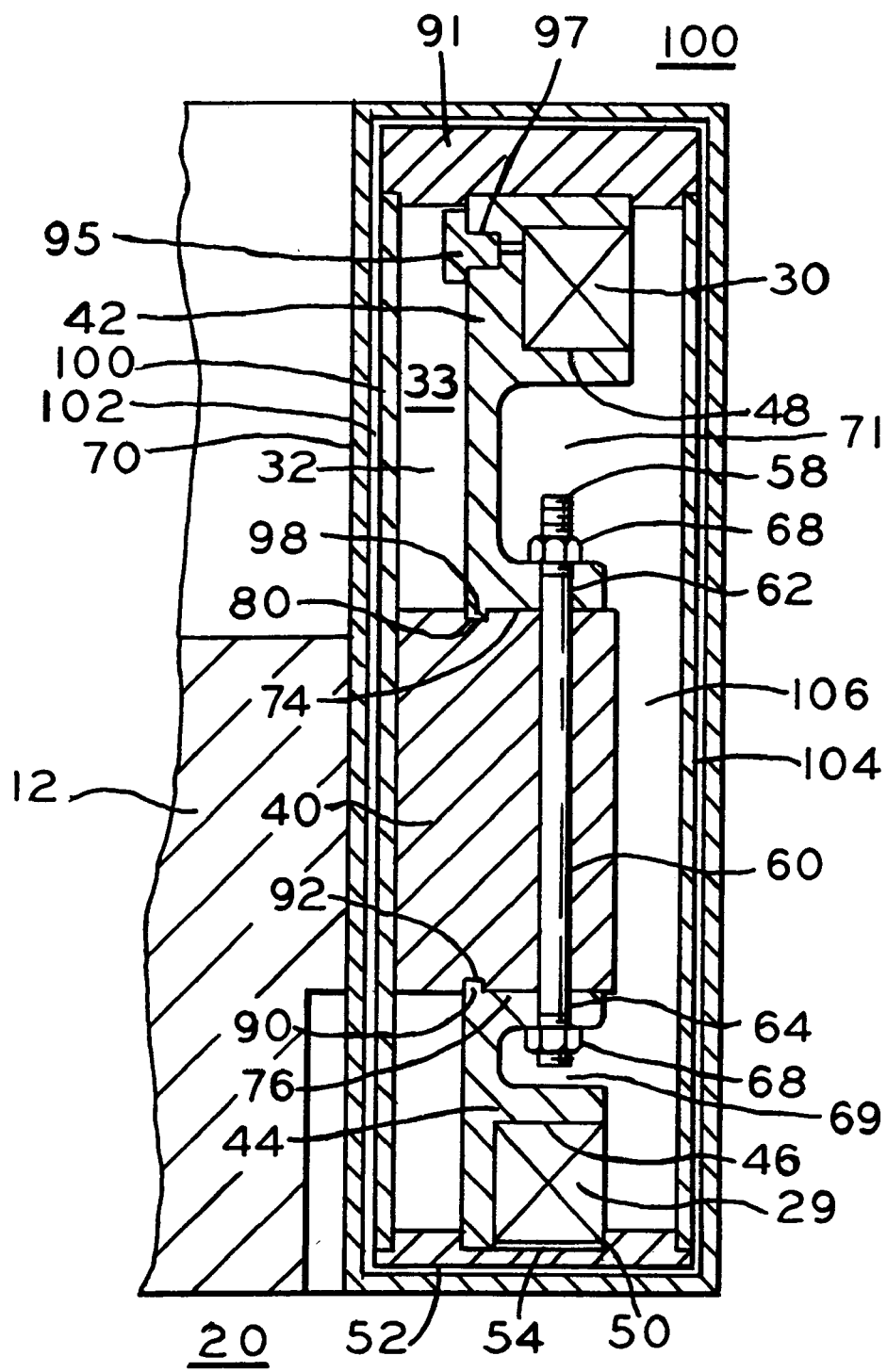
FIG_2

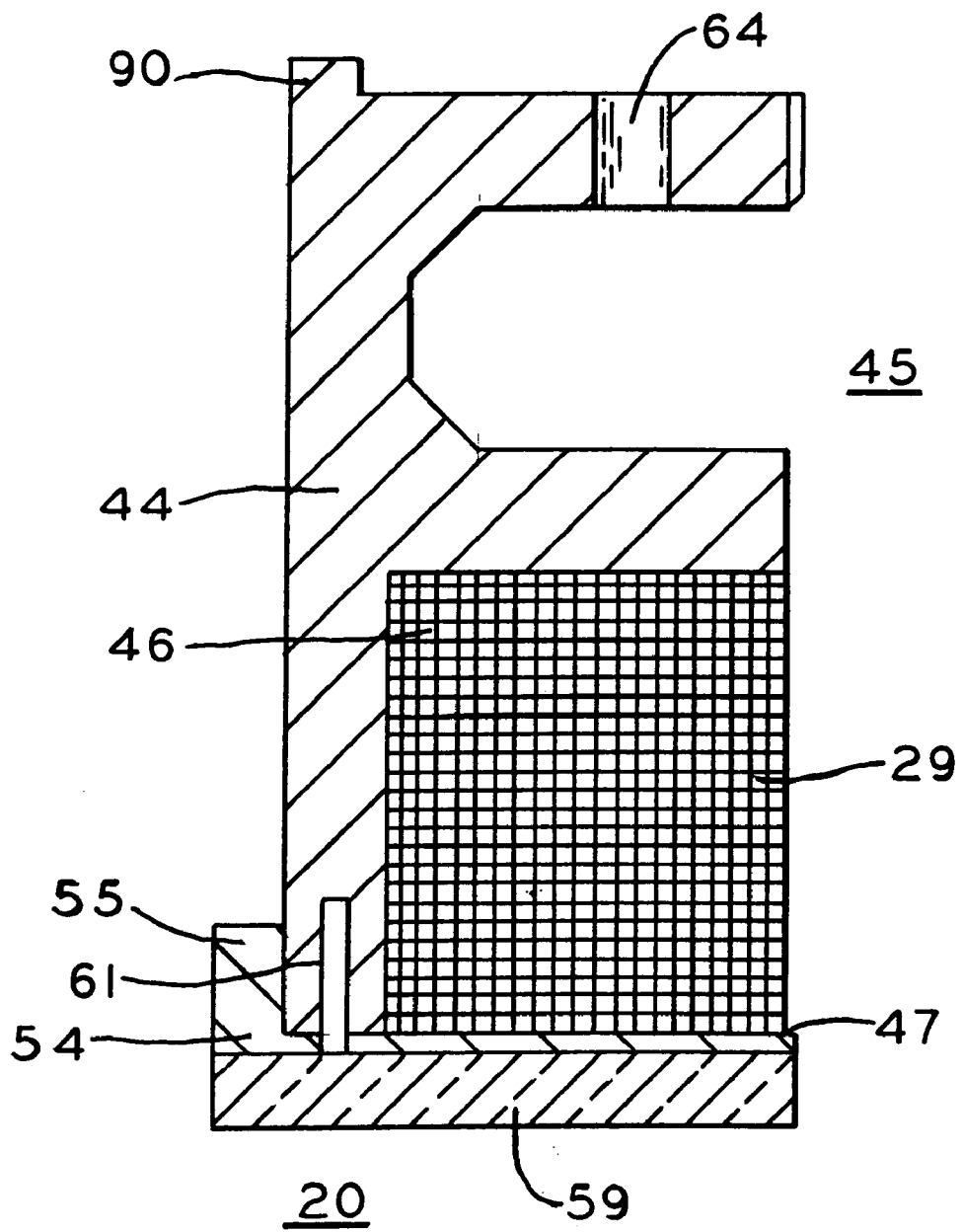
FIG_3

OPEN ARCHITECTURE SUPERCONDUCTING MAGNET HELIUM VESSEL STRUCTURE

BACKGROUND OF INVENTION

This invention relates to an open architecture superconducting magnet cryogen vessel structure suitable for magnetic resonance imaging, and in particular to the magnetic components assembly within the cryogen vessel.

As is well known, a superconducting magnet can be made superconducting by placing it in an extremely cold environment, such as by enclosing it in a cryostat or pressure vessel containing liquid helium or other cryogen. The extreme cold ensures that the magnet coils can be made superconducting, such that when a power source is initially connected to the magnet coils (for a relatively short period) current continues to flow through the coils even after power is removed due to the absence of resistance, thereby maintaining a strong magnetic field. Superconducting magnets find wide application in the field of Magnetic Resonance Imaging (hereinafter MRI).

Another problem encountered by conventional and early MRI equipments is that they utilize solenoidal magnets enclosed in cylindrical structures with a central bore opening for patient access. However, in such an arrangement, the patient is practically enclosed in the warm bore, which can induce claustrophobia in some patients. The desirability of an open architecture magnet in which the patient is not essentially totally enclosed has long been recognized. Unfortunately, an open architecture poses a number of technical problems and challenges.

One type of open architecture superconducting magnet utilizes a split dewar or split liquid helium vessels with the lower helium vessel and the upper helium vessel connected by one or more supports on one end of the vessels.

Such open architecture superconducting magnets may utilize or require iron rings to shape and confine the magnetic field. The field strength of such magnets affects the signal-to-noise ratio and imaging quality. However, open architecture superconducting magnets provide a generally low field strength as compared with more conventional cylindrical magnets.

Problems encountered as a result of the incorporation of iron rings include the interaction of the strong magnetic field of the superconducting magnet coil with the iron rings. In addition, the thermal differential expansion and contraction of the iron ring and the magnetic components during the temperature cycles of over 400° F. encountered in ramping up the magnet to superconducting operation, or the warm up after discontinuance of superconducting operation, present difficulties in the design of a suitable magnet structure. Still further, the magnet assembly must support and maintain accurate spacing between the iron ring and the magnet coils.

It is also highly desirable to maximize the patient space between the superconducting magnet coils closest to the imaging region while at the same time providing adequate support for those magnetic coils.

Thus, difficulties are presented in maintaining imaging quality, and in maintaining precise magnetic components support and fixed relative positioning in the presence of such severe and conflicting environmental and operational considerations.

SUMMARY OF INVENTION

Thus, there is a particular need for a cryogen vessel structure suitable for use in an open architecture superconducting magnet to overcome the aforementioned problems.

In accordance with one form of the invention, an open architecture superconducting magnet includes an upper and lower separated cryogen vessel, each including superconducting magnet coils and liquid cryogen with a support assembly connecting the vessels. A magnetic cartridge supports and positions the magnetic components including a ferromagnetic ring interposed between a pair of ring-shaped coil forms each including a superconducting coil in a coil pocket. A plurality of radially extending studs and nuts pass through the ring and a portion of each coil form to secure the assembly together. Circumferential tongues on the coil forms mate with circumferential grooves in the ferromagnetic ring to provide axial coil positioning. The magnet assembly is in turn secured and positioned within circumferential grooves in a cartridge housing. An open ended coil form pocket with a stainless steel flange retains the coil closest to the imaging region while maximizing the patient space in the region between the pair of spaced cryogen vessels each including a magnet cartridge.

BRIEF DESCRIPTION OF DRAWINGS

FIG. 2 is an enlarged view of a portion of FIG. 1 showing details useful in explaining the invention.

FIG. 3 is an enlarged detailed view of one of the magnet coil forms of FIGS. 1 and 2.

DETAILED DESCRIPTION OF PREFERRED EMBODIMENTS

Figure 1:
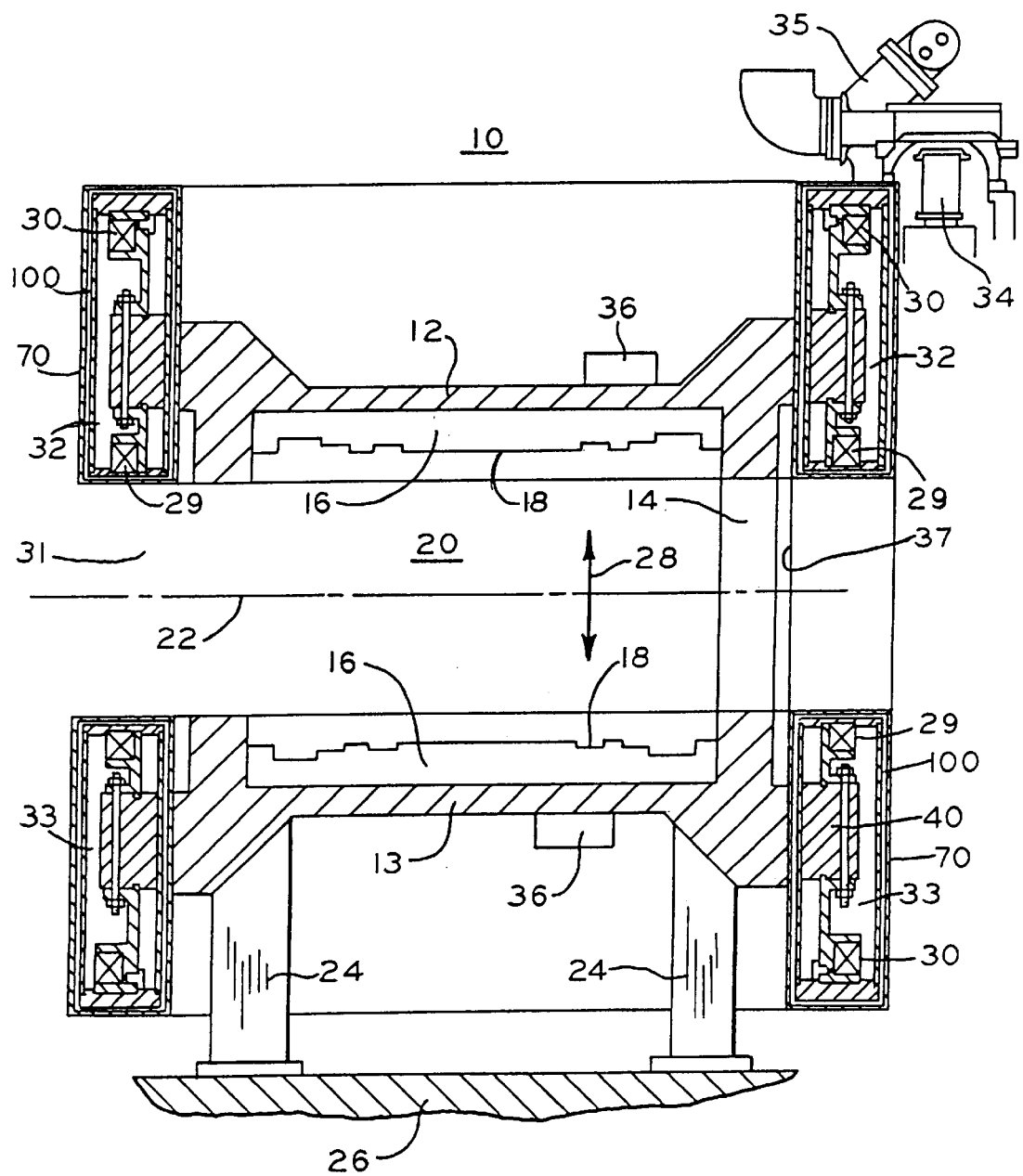
FIG. 1 is a simplified cross-sectional side view of a superconducting magnet including the subject invention.

Referring to FIGS. 1 and 2, open architecture superconducting magnet 10 includes spaced parallel pole pieces 12 and 13 separated and supported at one end by a pair of non-magnetic connecting members or posts 14. Pole pieces 12 and 13 are of ferromagnetic material such as iron. Pole faces 16 are shaped 18 to improve magnetic field homogeneity within imaging region 20 along axis 22 of superconducting magnet 10. Supports 24 secure magnet 10 to floor 26.

The main magnetic field, Bo, indicated generally by arrow 28 within imaging region 20 is generated by magnet coils 29 and 30 within helium vessels 32 and 33. Spaced helium vessels 32 and 33 are cylindrical members providing an open end 31 to imaging region 20. Magnetic field shimming apparatus such as correction coils (not shown) within cryogen vessels 32 and 33 and passive shims in external shim drawers indicated generally as 36 compensate for magnetic field inhomogeneities within imaging region 20 in the manner well known in the art. A recondenser 34 and associated mechanical cryocooler 35 (which may be a 2 stage Gifford-McMahon cryocooler) recondenses helium gas which results from the superconducting operation back to liquid helium. The recondensed liquid helium flows from recondenser 34 by gravity into upper helium vessel 32. A vertical transfer tube 37 interconnects helium vessels 32 and 33 and enables the gravity flow of helium from upper helium vessel 32 to lower helium vessel 33.

As best shown in FIG. 2, superconducting magnet coils 29 and 30 are assembled into a magnet assembly 33 with cold iron ring 40 interposed between the coils. Coils 29 and 30 are supported on glass fiber-epoxy composite coil supports 44 and 42, respectively, in pockets 46 and 48, respectively, machined for the coils. Pocket 46 is L-shaped and open ended and abuts open ended rectangular pocket 50 machined into end member 52 and assembled with thin stainless steel flange 54 to complete the pocket. Flange 54 is mechanically attached to coil support 44 to retain magnet coil 29 in place prior to assembly of magnet assembly 33.

In an open architecture magnet such as shown in FIG. 1, the placement of magnet coil 29 to provide the necessary magnetic field strength and quality for MRI imaging leaves less vertical space available between the coil and imaging region 20 than is desired since one objective is to obtain as much vertical open space as possible for comfort of the patient. It is important, however, that coil support 44 provide both axial and radial support to avoid any magnet coil 29 conductor movement which could result in poor imaging quality or even lead to superconducting magnet 10 quench or discontinuance of superconducting operation. A quench can result in considerable expense and MRI equipment downtime before superconducting magnet 10 can be replenished with liquid helium and the magnet ramped up to superconducting operation.

It is thus becomes important to provide a coil form assembly which enables proper winding and positioning of the magnet coil closest to imaging region 20 and which also provides good radial and axial coil retention in the presence of the strong magnetic fields provided during superconducting operation.

FIG. 3 is an enlarged view of magnet coil 29 assembly 45. Referring to FIG. 3, FRP coil form 44 includes an open coil pocket 46 for the magnet coil machined in the coil form. Prior to winding coil 29, the open end of coil pocket 46 is closed by insulating layer 47 and stainless steel flange 54 which includes vertical rim portion 55 for positioning against coil form 44. A plurality of Attachment screws 61 around the periphery of coil form 44 secure insulating layer 47 and stainless steel flange 54 to the coil form. Stainless steel flange 54 is much stronger and stiffer than that required for an FRP counterpart. As a result, much less thickness is required, providing increased patient space between coil 29 and imaging region 20.

If desired, a thicker reinforcing ring 59 may be utilized as a fixture in the winding of magnet coil 29 on coil form 4 after which it can be removed.

Magnet assembly 33 further includes a plurality of stainless steel threaded studs 58 (see FIG. 2) passing through apertures 60 in iron ring 40 and mating apertures 62 and 64 in coil supports 42 and 44 with ends 58 of each stud positioned within cylindrical grooves 69 and 71, respectively. Ends 58 of studs 60 are secured by bolts 68. A plurality of 16 studs or securing rod 58 and bolts 68 combinations are equally spaced around iron ring 40 to firmly and positively position and secure coils 29 and 30 about iron ring 40.

Circumferential positioning grooves 80 and 92 around the exterior circumference and the interior circumference, respectively, of iron ferromagnetic ring 40 provide positive positioning and support for coil forms 42 and 44 through tongues or mating circular extensions 98 and 90 which extend from the coil forms into the positioning grooves.

Eight support pins 95 spaced equally around the circumference at end flange 91 mate with apertures 97 in coil form 42 along the outer end remote from imaging region 20. Pins 95 support magnet assembly 33 when superconducting magnet 10 is not energized and during transportation of the magnet. Assembly 33 seats in rectangular pocket 50 in aluminum end flange 52 closest to axis 22 (see FIG. 1). End flange 52 is thicker than necessary for the pressure boundary. Differential contraction between assembly 33 and end flanges 52 and 91 constrain the assembly including coils 29 and 30 in the radial direction.

Magnet assembly 33 is positioned within an aluminum housing which includes end flange rings 91 and 52 around the ends and washer shaped sides 102 and 104. The complete assembly is cartridge 100 in which the magnet components are precisely and firmly positioned and which maintain their positioning, radially and axially, in the presence of the strong magnetic field during superconducting operation and the strong forces exerted on iron ring 40. A liquid cryogen such as liquid helium 106 provides cryogenic temperatures for superconducting operation of superconducting magnet 10.

Cylindrical donut-shaped magnet cartridge assembly 100 may thus be assembled prior to its insertion into an enclosure formed by cryogen pressure vessel 70 (see FIG. 1) which is fabricated of high strength structural aluminum. Cartridge 33 includes superconducting magnet coils 29 and 30 supported in coil supports 42 and 44. Coil supports 42 and 44 are in turn secured on opposite sides of iron ring 40 by studs 58 and bolts 68.

Stainless steel studs 68 retain the joint compression at joints 74 and 76 between iron ring 40 and associated coil assemblies 42, 30 and 44, 29, respectively. Retention of joint compression precludes joint 74 and 76 separation during warm transportation of superconducting magnet 10. As superconducting magnet 10 cools during periods of superconducting operation the difference in thermal contraction between iron ring 40 and stainless steel studs and nuts 62, 68 results in sufficient compression to preclude separations at joints 74, 76. The use of locking nuts for nuts 68 precludes loosening of assembly 33. Liquid helium 102 between cartridge 100 and cryogen or helium pressure vessel 70 provides cryogenic cooling.

Tongue and groove combinations 90, 92 and 98, 80 provide radial coil to coil positioning and alignment. As assembly 33 cools during ramping up of superconducting magnet 10 to superconducting operation, differential contraction between iron ring 40 and coil forms 42 and 44 provides self-alignment of tongues 98 and 90 in grooves 80 and 92, respectively. Axial positioning of superconducting magnet coils 29 and 30 is achieved by dimensional control of the magnet components to a common datum at the outer coil 30 end flange 91 avoiding the possibility of cumulative tolerance buildup.

Magnet assembly 33 thus facilitates assembly of the magnetic components into magnet cartridge 100 and also accurately positions and maintains position of the magnetic components during transportation and during, ramping up or cooling down to superconducting temperatures to provide superconducting operation, and subsequent warm up to ambient temperatures after the discontinuance of superconducting operation temperature which provide changes and temperature cycles of over 400° F. The large temperature swings exert significant pressures due to differential expansion and contraction of the various materials of cartridge 100 in response to temperature changes. Magnet assembly 33 and magnet cartridge 100 also provide strength and rigidity during transportation of the magnet whether to its installation site from the factory, or between various MRI testing locations or medical clinics in the case of a mobile MRI shared by a plurality of medical locations.

The positive and consistent alignment of the magnetic components, coils 29 and 30 and iron ring 44 contributes greatly to imaging quality in imaging region 20 during MRI imaging, and also contributes to maintaining positioning of the magnetic components during transportation of superconducting magnet 10. Magnet assembly 33 also resists the effects of the magnetic forces and interactions between superconducting magnet coils 29 and 30 and iron ring 40.

In a superconducting magnet in which two superconducting magnet coils 29 and 30 are separated by an iron ring the forces from the magnet coils are outward, away from iron ring 40. This net outward force on helium vessel 70 is transferred to the magnet suspension assembly 33, and the interaction between the magnet coils and iron ring tends to open joints 74 and 76 between the iron ring and the magnet coils. However, the strong, positive positioning both radially and axially, provided by magnet assembly 33 and magnet cartridge 100 resists such opening or movement which would otherwise degrade the MRI imaging quality in imaging volume 20.

While the present invention has been described with respect to certain preferred embodiments thereof, it is to be understood that numerous variations in the details of construction, the arrangement and combination of parts, and the types of materials used may be made without departing from the spirit and scope of the invention.

What is claimed is:

1. An open architecture superconducting magnet assembly including upper and lower liquid cryogen vessels to provide a magnetic field therebetween suitable for magnetic resonance imaging comprising:

upper and lower separated superconducting magnet coils in each of the cryogen vessels;

a ferromagnetic ring having an outer circumference and an inner circumference interposed between said upper and lower superconducting magnet coils;

said superconducting magnet coils each supported by a coil form;

one of said coil forms surrounding said outer circumference of said ring;

the other of said coil forms positioned within said interior circumference of said ring;

said coil forms supported by said ferromagnetic ring;

positioning and securing apparatus for said coil forms;

said positioning and securing apparatus including a plurality of radially extending fasteners spaced around said ferromagnetic ring securing said coil forms to said ferromagnetic ring and said fasteners are securing rods including ends which extend from said ferromagnetic ring into said coil form to secure said coil forms and said ferromagnetic ring into a unitary structure;

said coil forms include a circumferentially extending tongue on the circumference adjacent said ferromagnetic ring which mate with circumferential grooves on said outer circumference and said inner circumference of said ring to axially position said superconducting magnet coils on said ring in a predetermined axial position relative to each other and to resist axial movement of said coils when said coil forms are secured to said ring; and said coils, coil forms and ring are positioned and secured within a housing including an interior circumference to form a pair of magnet cartridge subassemblies and one of said magnet cartridge subassemblies is in turn positioned within each said cryogen vessel.

2. The superconducting magnet assembly of claim 1 wherein, said coil forms are filament wound and machined fiber-epoxy composite.

3. The cryogen vessel magnet assembly of claim 1 wherein, liquid cryogen is provided within said cryogen vessel around said magnet cartridge subassembly.

4. The superconducting magnet assembly of claim 3 wherein a plurality of support pins spaced around said interior circumference of said housing mate with apertures in the periphery of said outer coil form to secure said magnet assembly within said housing during transportation thereof.

5. The superconducting magnetic assembly of claim 3 wherein, said housing is aluminum and said studs are stainless steel to resist the strong magnetic forces generated by said superconducting magnet coils which tend to separate said ferromagnetic ring and said coil forms.

6. A superconducting magnet assembly which is generally donut shaped within a cryogen vessel of an open architecture magnetic resonance imaging magnet, comprising:

an iron ring including an exterior circumference and an interior circumference;

a first ring-shaped coil form positioned around said exterior circumference of said iron ring;

a second ring-shaped coil form positioned within and adjacent said interior circumference of said iron ring;

said ring-shaped coil forms each including a coil pocket;

superconducting magnet coils wound in each of said pockets;

a plurality of radial studs extending through said iron ring and through a portion of each said coil forms to secure said coil forms to said ring and preclude separation of said coils and said iron ring;

a housing surrounding said superconducting magnet assembly with ends that include recesses to position and secure said superconducting magnet assembly within said housing to form a magnet cartridge; and one said magnet cartridge positioned and secured within each said cryogen vessel.

7. The magnet of claim 6 further including a cryogen pressure vessel surrounding said magnet cartridge with a liquid cryogen positioned between said magnet cartridge and said cryogen pressure vessel.

8. The superconducting magnet assembly of claim 6, wherein, peripheral grooves are provided around the outer and inner circumferences of said iron ring, and said coil forms include circumferentially extending tongues which extend into and mate with said grooves to position said coil forms and said superconducting coils on said iron ring and to prevent axial movement therebetween.

9. The superconducting magnet assembly of claim 8, wherein, said coil forms include outer ends remote from said iron ring, a housing encloses said magnet assembly, and said housing includes internal grooves into which said ends of said coil forms of said magnet assembly are positioned and secured.

10. The superconducting magnet assembly of claim 9, wherein, said housing includes circumferential ends and at least one of said circumferential ends of said housing is detachable to open said housing and enable insertion of said magnetic assembly to form a magnetic cartridge which is suitable for insertion into said cryogen pressure vessel of said superconducting magnet.

11. The superconducting magnet assembly of claim 10, wherein, said radial studs include ends and said ends of said radial studs are threaded and locking nuts are threaded to cooperate with the threaded ends to secure said coil forms and said iron ring together.

12. The superconducting magnet assembly of claim 11, wherein, selectively attachable peripheral pins are provided in said housing to support said magnet assembly within said housing during transportation of said superconducting magnet assembly.

13. The superconducting magnet assembly of claim 6, wherein, there is an open patient region in the central region of said magnet assembly and said second coil form is fiber-epoxy composite and includes an open ended coil pocket with a stainless steel flange closing said open end to minimize the thickness of said coil form in closing said open end to maximize said open patient region.

14. The superconducting magnet assembly of claim 6, wherein, said second ring-shaped coil is positioned in said open ended coil pocket and an insulator is interposed between said second ring-shaped coil and said stainless steel flange.

15. The magnet assembly of claim 14 wherein, a plurality of screws extend through and secure said insulator to said stainless steel flange.

* * * * *